(12) United States Patent
Borkar et al.

(10) Patent No.: US 6,747,474 B2
(45) Date of Patent: Jun. 8, 2004

(54) INTEGRATED CIRCUIT STUBS IN A POINT-TO-POINT SYSTEM

(75) Inventors: Shekhar Y. Borkar, Beaverton, OR (US); Matthew B. Haycock, Beaverton, OR (US); Stephen R. Mooney, Beaverton, OR (US); Aaron K. Martin, Hillsboro, OR (US); Joseph T. Kennedy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 429 days.

(21) Appl. No.: 09/797,480

(22) Filed: Feb. 28, 2001

(65) Prior Publication Data

US 2002/0117745 A1 Aug. 29, 2002

(51) Int. Cl.$^7$ ............... H03K 17/16; H03K 19/0175
(52) U.S. Cl. .................... 326/21; 326/30; 326/86
(58) Field of Search .................... 365/51, 52, 63, 365/203.03, 230.06, 233; 326/21, 30, 86; 711/5

(56) References Cited

U.S. PATENT DOCUMENTS

| | | | |
|---|---|---|---|
| 4,703,198 A | * 10/1987 | Porter et al. | 326/86 |
| 5,604,450 A | 2/1997 | Borkar et al. | 326/82 |
| 5,955,894 A | * 9/1999 | Vishwanthaiah et al. | 326/30 |
| 5,982,192 A | * 11/1999 | Saito | 326/30 |
| 6,115,318 A | * 9/2000 | Keeth | 365/233 |
| 6,437,601 B1 | * 8/2002 | Borkar et al. | 326/93 |
| 6,502,161 B1 | * 12/2002 | Perego et al. | 711/5 |

OTHER PUBLICATIONS

J. Gabara, "Digitally Adjustable Resistors in CMOS for High-Performance Applications," IEEE Journal of Solid-State Circuits, vol. 27, No. 8, Aug. 1992, pp. 1176–1185.
R. Farad-Rad, "A 0.4-um CMOS 10-Gb/s 4-PAM Pre-Emphasis Serial Link Transmitter," IEEE Journal of Solid-State Circuits, vol. 34, No. 5, May 1999, pp. 580–585.
C. Smythe, "ISO 8802/5 token ring local-area networks," Electronics & Communication Engineering Journal, Aug. 1999, pp. 195–297.
T. Starr, "Understanding Digital Subscriber Line Technology," Chapter 7, pp. 202–205, Prentice Hall PTR, Upper Saddle River, NJ, 1999.

* cited by examiner

*Primary Examiner*—Trong Phan
(74) *Attorney, Agent, or Firm*—Alan K. Aldous

(57) ABSTRACT

In some embodiments, the invention involves multiple integrated circuit stubs coupled in series. At least one of the integrated circuit stubs including first conductors to receive signals from a first adjacent one of the integrated circuit stubs, second conductors to provide signals to a second adjacent one of the integrated circuit stubs, and third conductors to provide signals to an integrated circuit chip. The integrated circuit stubs include first drivers and second drivers coupled to the first, second, and third conductors, wherein the first drivers receive the external signals from the first conductors and drive them onto the second conductors and the second drivers receive signals from the first conductors and drive them onto the third conductors.

23 Claims, 4 Drawing Sheets

INTEGRATED CIRCUIT STUBS IN A POINT-TO-POINT SYSTEM

BACKGROUND OF THE INVENTION

1. Technical Field of the Invention

The present invention relates to integrated circuits and, more particularly, use of active integrated circuit stubs in a point-to-point system of integrated circuits.

2. Background Art

FIG. 1 illustrates a system 10 of integrated circuits including integrated circuits IC0, IC1, IC2 . . . ICn. The integrated circuits are connected through a bus 16. Integrated circuit IC0 may be a controller to control IC1, IC2 . . . ICn or can be the same as them or can be the same as other integrated circuits or can be different. System 10 may be a system that is referred to as multi-drop system in which one or more of integrated circuits IC1, IC2 . . . ICn are selectively joined to bus 16 through stubs 18-1, 18-2, . . . 18-n, respectively. Merely as an example, system 10 may be a memory system in which controller 14 is a memory controller (either joined with a processor on chip or in a different chip from the processor) and in which integrated circuits IC1, IC2 . . . ICn are, for example, dynamic random access memory (DRAM) chips that are on one or more printed circuit boards (PCBs). They could also be in a multi-processor system.

Address, data, and control bits on bus 14, may be on separate conductors of bus 14 or they may be, for example, time division multiplexed or packetized. For example, bus 14 may include some conductors used to carry only address bits, some conductors used only to carry only control bits, and some conductors used to carry only data bits. Or, some conductors may be used to transmit some combination of address, control, and/or data bits at different times or through a packetized or arrangement.

FIG. 2 illustrates a system 20 including integrated circuits IC0, IC1, IC2 . . . ICn. The integrated circuits are connected through busses 24-1, 24-2, . . . 24-n. IC0 may be a controller to control the other integrated circuits or can be the same as them. System 20 is of the type that is sometimes referred to as point-to-point bus system. An optional conductor 28 completes the loop. System 10, by contrast, is referred to as a radial bus system.

A disadvantage of radial bus systems is that they are slower do to the relatively large amount of capacitance associated with relatively long conductors and multiple receiving circuitry in IC0, IC1, IC2, . . . ICn. An associated disadvantage is that energy is dispersed through the stubs as well as through the bus. For example, in FIG. 1, at the junction of the bus 16 and stub 18-1, some electrical energy passes through stub 18-1 and other electrical continues through bus 18 past stub 18-1. This reduces the effective bus speed.

Another disadvantage of current point-to-point systems is that in many systems there is a set number of chips. Even if the number of chips can be added to by adding to the last chip, if a chip in the interior of the loop fails, the whole system is down. For example, in FIG. 2, if IC2 is defective, the entire system may be nonoperational. By contrast, multi-drop systems are typically relatively easy to add to and in many such systems, if one of the chips fails, the system as a whole can still operate. For example, in FIG. 1, if IC2 is defective, the rest of the system may be able to continue.

Bi-directional signaling refers to using the same conductors to transmit signals in both directions. For example, data may be transmitted either to or from an integrated circuit. If the same conductor is used in both directions, the signaling is bi-directional. The bi-directional signaling may be sequential or simultaneous. In the case of sequential bi-directional signaling, enable signals may be used to, for example, tri-state or turnoff unused drivers or receivers. In the case of simultaneous bi-directional signaling, the threshold voltage of the receiver may be changed depending on the state of the adjacent driver. For example, if the adjacent driver is transmitting a 0, the receiver threshold may be set to Vcc/4. If the remote driver is also 0, the threshold will not be met. If the remote driver is a 1, the Vcc/4 threshold will be met. If the adjacent driver is also transmitting a 1, the receiver threshold may be set to 3Vcc/4. If the remote driver transmits a 1, the threshold will be met and if it transmits a 0, the threshold will not be met.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

The present involves the use of integrated circuit stubs in a point-to-point system. In the illustrated embodiments, drivers are used in the stubs, so the stubs are referred to as being active stubs.

Figure 3:
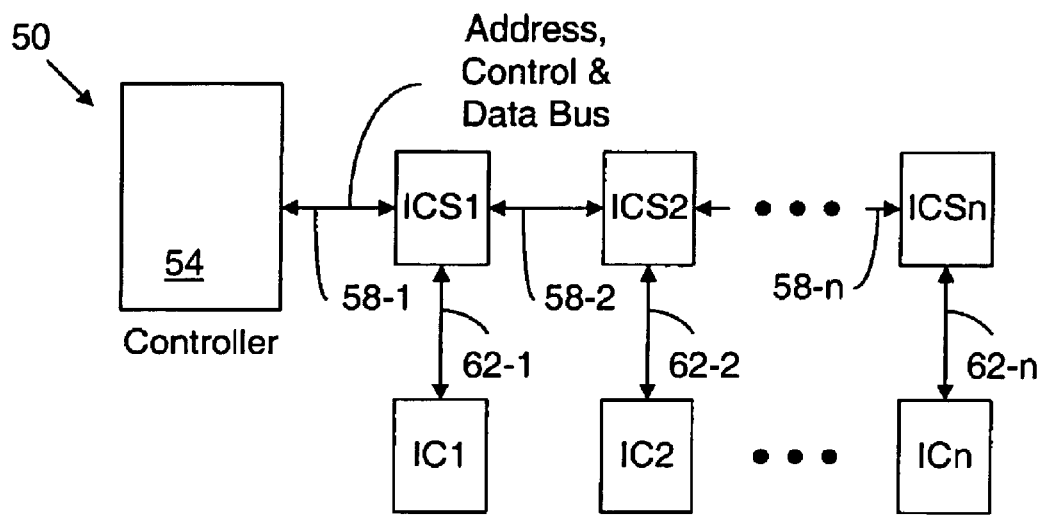
FIG. 3 is a block diagram representation of a system according to some embodiments of the present invention.

FIG. 3 illustrates a system 50 including a controller 54. Controller 54 may be part of another chip (such as a processor) or be a chip itself. Address, control & data bus 58-1 carries address data and control signals between controller 54 and integrated circuit stub ICS1. Address, data, and control bits on bus 58-1 may be on separate conductors of bus 58-1 or they may be, for example, time division multiplexed or packetized. For example, bus 58-1 may include some conductors used to carry only address bits, some conductors used only to carry only control bits, and some conductors used to carry only data bits. Or, some conductors may be used to transmit some combination of address, control, and/or data bits at different times or through a packetized or arrangement. In some embodiments, clock signals are also be carried buses 58-1, 58-2 . . . 58-n and/or 62-1, 62-2 . . . 62-n. In other embodiments, clock signals are carried on other conductors.

The invention is not limited to use in a system having a separate controller which is different than IC1, IC2, . . . ICn. In that sense, controller 54 is optional. In some embodiments, for example, controller 54 is the same as the other chips IC1, IC2 . . . IC0 and can be thought of as IC0. The invention may be used in connection with a variety of systems including memory systems, such as DRAM systems (in which IC1, IC2 . . . IC0 are DRAMs); multiprocessor computer systems (in which IC1, IC2 . . . IC0) are processors; communications systems and various other systems.

Integrated circuit stub ICS1 passes data on to a next integrated circuit stub ICS2 in a point to point fashion and to an integrated circuit IC1. Integrated circuits IC1, IC2 . . . ICn may be any of a variety of types of integrated circuits including memory and processors. There may be additional chips (not shown) in system 50 depending on the embodiment used in a particular implementation. For convenience, in this disclosure, to distinguish integrated circuit stubs and integrated circuits connected to them, when the nomenclature IC1, IC2 or ICn is not used in connection with the integrated circuit, the integrated circuits connected to the stubs are called integrated circuit chips. Of course, the stubs might also be called chips, but this is not done to avoid confusion.

Figure 1:
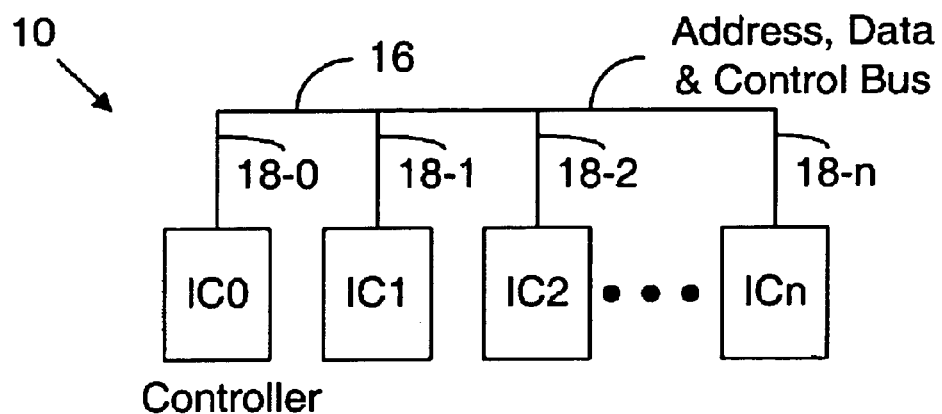
FIG. 1 is a block diagram representation of a prior art system having multiple integrated circuits in a radial arrangement.
Figure 2:
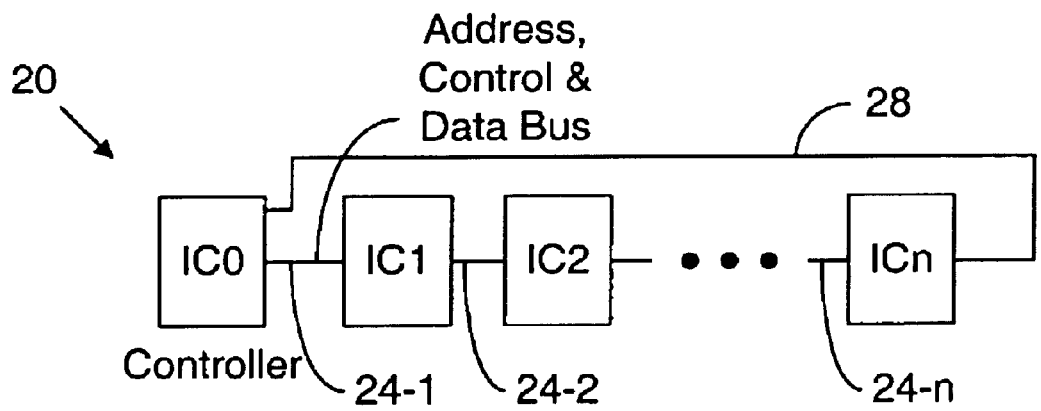
FIG. 2 is a block diagram representation of a prior art system having multiple integrated circuits in a point-to-point arrangement.

An advantage of system 50 over current systems is that if one of integrated circuits IC1, IC2 . . . ICn is defective or removed, the system will work for the remaining integrated circuits. For example, if only integrated circuit IC2 is defective, system 50 will work with integrated circuit IC1 and the other integrated circuits including ICn. By contrast, in system 20 (in prior art FIG. 2) if one of the integrated circuits is defective, it may prevent the entire system from working.

Figure 4:
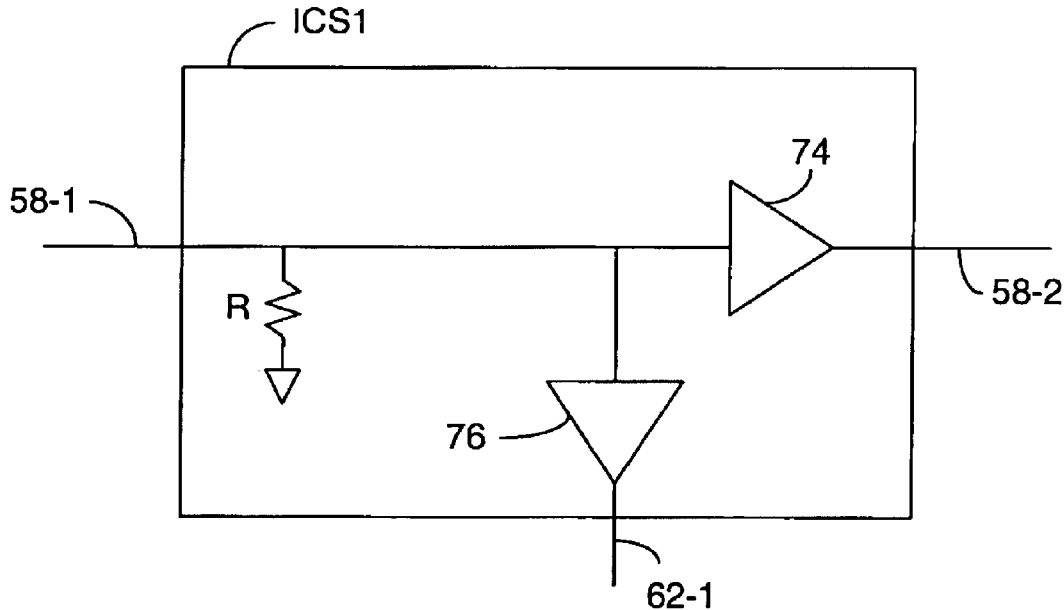
FIG. 4 is a block diagram representation of additional detail of an integrated circuit stub of FIG. 3 according to some embodiments of the invention.

There are various ways in which the integrated circuit stubs may be implemented. FIG. 4 illustrates in schematic form some details of integrated circuit stub ICS1. Of course, the invention is not restricted to these details Conductors of bus 58-1 may be terminated through resistors in integrated circuit stub ICS1 or elsewhere. Accordingly, resistors R shown in FIG. 3 are optional. Signals on conductors 58-1 are received by drivers 74 and drivers 76. Drivers 74 provide the signals from conductors 58-1 to conductors 58-2 to be carried to integrated circuit stub ICS2. Drivers 76 provide the signals from conductors 58-1 to conductors 62-1 to be carried to integrated circuit IC1. There may be additional drivers and control circuitry (not shown). Drivers are not necessary in all embodiments. That is, there could be an integrated circuit stub without driver 74 or 76. There may be resistive termination for conductors 58-2 either in integrated circuit stub ICS1, integrated circuit stub ICS2, or elsewhere.

Figure 5:
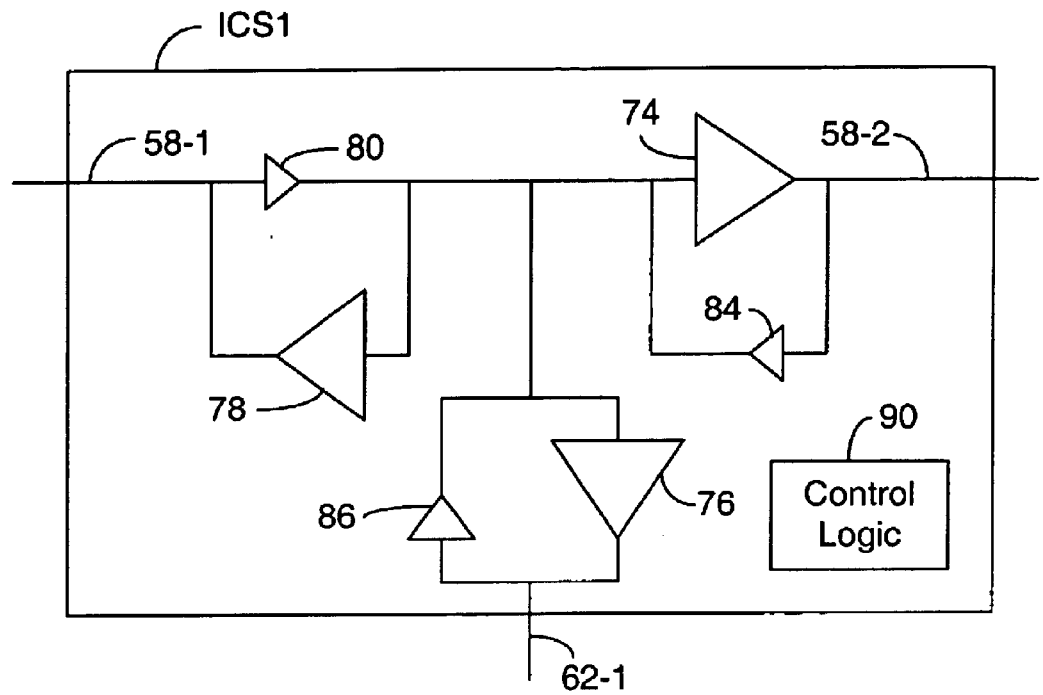
FIG. 5 is a block diagram representation of additional detail of an integrated circuit stub of FIG. 3 according to some embodiments of the invention.

FIG. 5 illustrates other embodiments of integrated circuit stub ICS1 in which at least some of the conductors of buses 58-1, 58-2 and 62-1 are bi-directional conductors. A bi-directional conductor is one that carries signals in both directions either concurrently or simultaneously. Drivers 80 receive signals on conductors 58-1 and provide them to drivers 74 and 76 to be passed on to conductors 58-2 and 62-1. Drivers 84 receive signals on conductors 58-2 and provide them to drivers 76 and 78 to be passed on to conductors 62-1 and 58-1. Drivers 86 receive signals on conductors 62-1 and provide them to drivers 74 and 78 to be passed on to conductors 58-1 and 58-2. Drivers 80, 84, and 86 are shown as smaller triangles than drivers 74, 76 and 78 to suggest that they may be smaller and faster. Drivers 74 drive signals from conductors 58-1 and 62-1 to conductors 58-2. Drivers 78 drive signals from conductors 58-2 and 62-1 to conductors 58-1. Drivers 76 drive signals from conductors 58-1 and 58-2 to conductors 62-1. Termination resistors may be included in various locations. There may be additional circuitry not in FIG. 5 to control signals. Control logic 90 is optional. In some embodiments, signals are broadcast in both directions (e.g., 58-1 to 58-2 and 62-1) with chip selects or addresses controlling which of integrated circuits IC1, IC2 . . . ICn accept the signal. In other einbodiments, control circuitry controls drivers to control where signals are transmitted.

Figure 6:
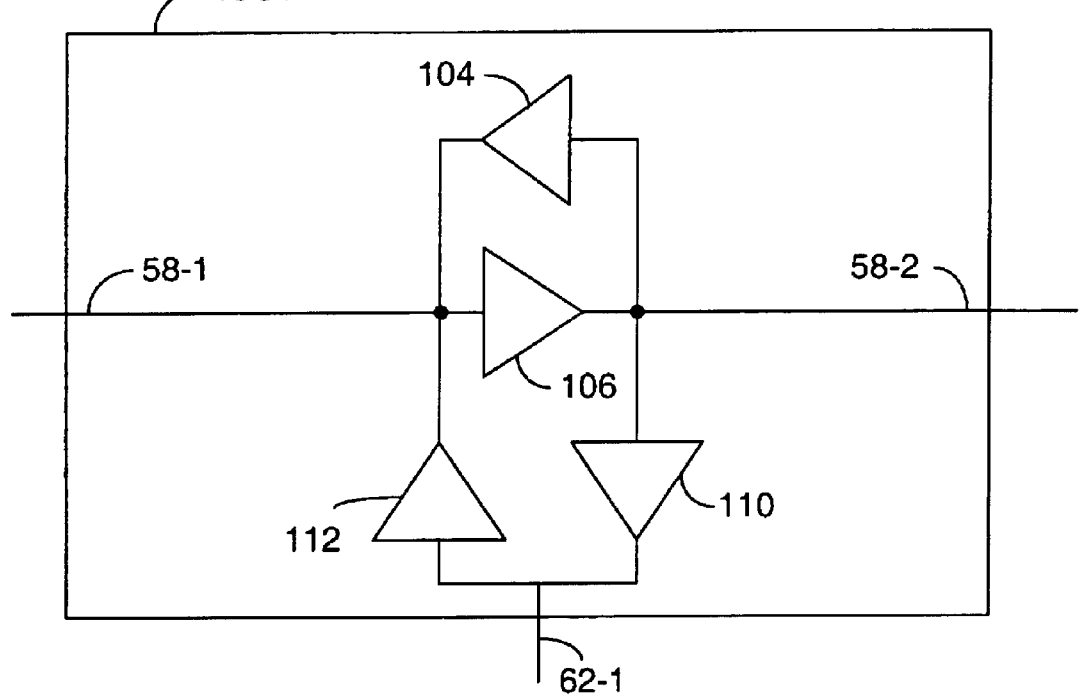
FIG. 6 is a block diagram representation of additional detail of an integrated circuit stub of FIG. 3 according to some embodiments of the invention.

FIG. 6 illustrates yet other embodiments of the integrated circuit stub ICS1. In these embodiments, drivers 106 drive signals from conductors 58-1 to conductors 58-2 and drivers 110. Drivers 104 drive signals from conductors 58-2 to conductors 58-1 and drivers 110. Drivers 112 drive signals from conductors 62-1 to conductors 58-1 and drivers 106. Drivers 110 drive signals from conductors 58-1 and 58-2 to conductors 62-1.

Figure 7:
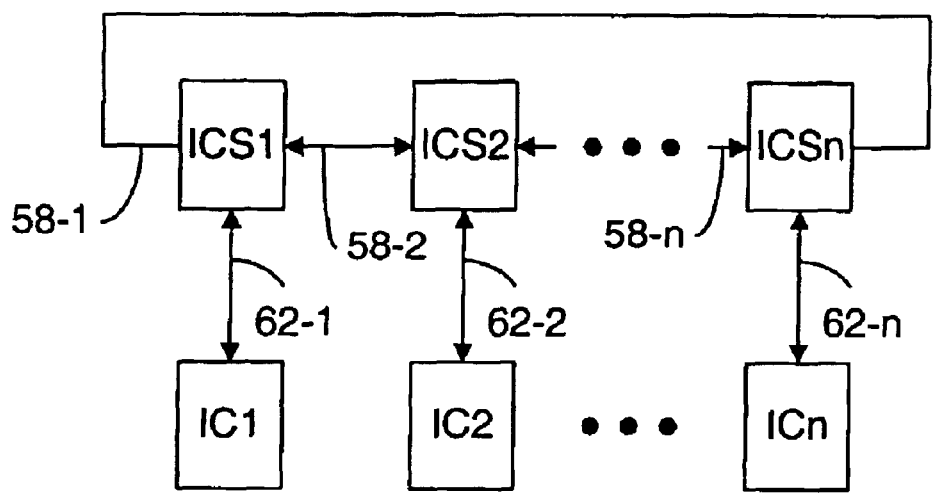
FIG. 7 is a block diagram representation of a system similar to that of FIG. 3 but in a ring arrangement.

As suggested by FIG. 4, system 50 may be used with unidirectional conductors. In the case of unidirectional signals, in some embodiments, the system includes a ring so that only one direction is needed as shown in FIG. 7. FIG. 7 is illustrates without controller 54, although it could have been included with the bus from ICSn going to controller 54. However, ring to structures like that of FIG. 7 (with or without controller 54) may also be used in conductors with bi-directional conductors like those of FIG. 5.

Figure 8:
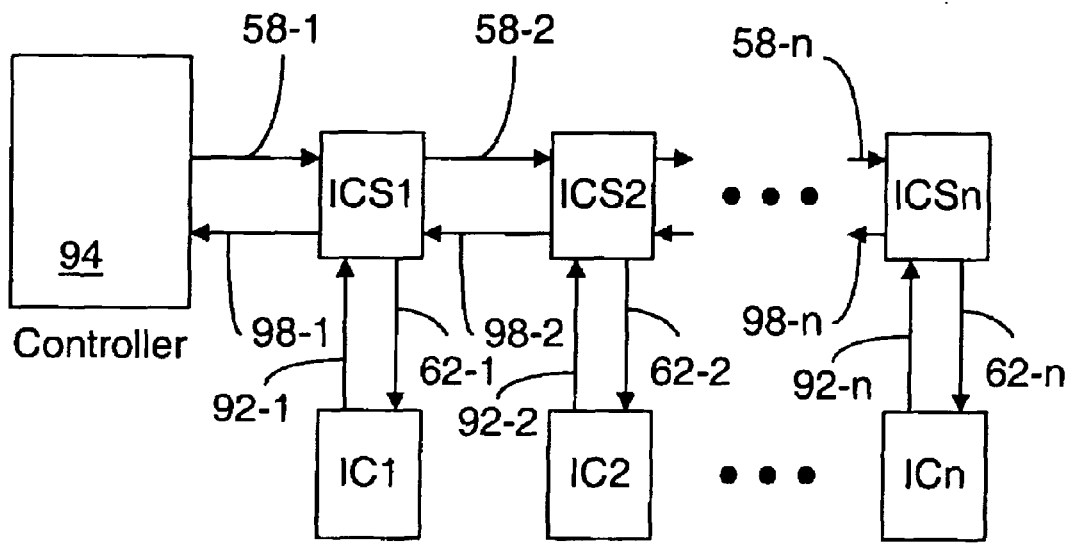
FIG. 8 is a block diagram representation of a system according to some embodiments of the present invention.

In other embodiments, there are two sets of conductors, one for one direction and one for another. For example, FIG. 8 illustrates a system in which different buses carry signal in different directions. For example, busses 58-1, 58-2 . . . 58-n transmit in one direction and busses 98-1, 98-2 . . . 98-n transmit in the other. Likewise, between the integrated circuit stubs and integrated circuit chips, buses 62-1, 62-2 . . . 62-n transmit in one direction and busses 92-1, 92-2 . . . 92-n transmit the other. The system of FIG. 8 could include a loop like in FIG. 7. Further, controller 94 is not required. FIG. 8 illustrates embodiments of integrate circuit stub ICS1 to be used in connection with the system of FIG. 7.

Some of the conductors of buses (e.g., 58-1, 58-2 . . . 58-n) may be unidirectional while others are bi-directional signals.

Note that although the system may be used in connection with point-to-point systems, it may be used in a hybrid system which is partially point to point and partially radial.

The conductors may be single ended or differential signaling may be used. Synchronous or asynchronous signaling may be used.

Although the integrated circuit stubs are illustrated with only three sets of inputs, then could have more than three inputs.

Additional circuitry that is not illustrated include electrostatic discharge circuits which are commonly used in integrated circuit interfaces. It is expected that such circuits would be used.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A system comprising:
multiple integrated circuit stubs coupled in series, at least one of the integrated circuit stubs including the following:
first conductors to receive signals from a first adjacent one of the integrated circuit stubs;
second conductors to provide signals to a second adjacent one of the integrated circuit stubs,
third conductors to provide signals to an integrated circuit chip; and
first drivers and second drivers coupled to the first, second, and third conductors, wherein the first drivers receive external signals from the first conductors and drive them onto the second conductors and the second drivers receive the external signals from the first conductors and drive them onto the third conductors.

2. The system of claim 1, wherein the conductors are used as unidirectional conductors.

3. The system of claim 1, wherein the conductors are used as bi-directional conductors.

4. The system of claim 1, wherein the multiple integrated circuit stubs are part of a ring.

5. The system of claim 1, further comprising a controller coupled to at least one of the integrated circuit stubs.

6. The system of claim 1, further comprising receivers and at least one additional driver.

7. The system of claim 6, wherein at least one of the integrated circuit stubs include control circuitry to control at least one of the drivers.

8. The system of claim 1, wherein the first conductors provide signals to the first adjacent one of the integrated circuit stubs and the third conductors receive signals from the integrated circuit chip.

9. The system of claim 1, wherein the second conductors receive signals from the second adjacent one of the integrated circuit stubs.

10. The system of claim 1, wherein the first driver is between the first conductors and second driver.

11. The system of claim 1, further comprising a third driver to provide signals from the second and third conductors to the first conductors.

12. A system comprising:
multiple integrated circuit stubs coupled in series, at least one of the integrated circuit stubs including the following:
first conductors to carry signals to and from a first adjacent one of the integrated circuit stubs;
second conductors to carry signals to and from a second adjacent one of the integrated circuit stubs,
third conductors to carry signals to and from an integrated circuit chip; and
first drivers, second drivers, and third drivers, wherein the first drivers receive first external signals from the first conductors and third external signals from the third conductors and drive them onto the second conductors, and the second drivers receive the first external signals from the first conductors and second external signals from the second conductors and drive them onto the third conductors, and the third drivers receive the second external signals from the second conductors and third external signals from the third conductors and drive them onto the first conductors.

13. The system of claim 12, wherein the multiple integrated circuit stubs are part of a ring.

14. The system of claim 12, further comprising a controller coupled to at least one of the integrated circuit stubs.

15. The system of claim 12, further comprising receivers.

16. The system of claim 12, wherein at least one of the integrated circuit stubs include control circuitry to control at least one of the drivers.

17. The system of claim 12, further comprising receivers between the first conductors and the first drivers and second drivers.

18. The system of claim 12, further comprising receivers between the second conductors and the second drivers and third drivers.

19. The system of claim 12, further comprising receivers between the third conductors and the second drivers and third drivers.

20. A system comprising:
multiple integrated circuit stubs coupled in series, at least one of the integrated circuit stubs including the following:
first conductors to carry signals to and from a first adjacent one of the integrated circuit stubs;
second conductors to carry signals to and from a second adjacent one of the integrated circuit stubs,
third conductors to carry signals to and from an integrated circuit chip; and
first receivers to receive first external signals from the first conductors, second receivers to receive second external signals from the second conductors, and third receivers to receive third external signals from the third conductors; and
first drivers, second drivers, and third drivers, wherein the first drivers receive the first external signals from the first receivers and the third external signals from the third receivers and drive them onto the second conductors, and the second drivers receive the first external signals from the first receivers and the second external signals from the second receivers and drive them onto the third conductors, and the third drivers receive the second external signals from the second receivers and the third external signals from the third receivers and drive them onto the first conductors.

21. The system of claim 20, wherein the multiple integrated circuit stubs are part of a ring.

22. The system of claim 20, further comprising a controller coupled to at least one of the integrated circuit stubs.

23. The system of claim 20, wherein at least one of the integrated circuit stubs include control circuitry to control at least one of the drivers.

* * * * *

UNITED STATES PATENT AND TRADEMARK OFFICE
CERTIFICATE OF CORRECTION

PATENT NO.   : 6,747,474 B2
DATED         : June 8, 2004
INVENTOR(S)  : Borkar et al.

It is certified that error appears in the above-identified patent and that said Letters Patent is hereby corrected as shown below:

<u>Column 4</u>
Line 7, after "not", insert -- shown --.
Line 11, delete "einbodiments" and insert -- embodiments --.

Signed and Sealed this

Sixteenth Day of November, 2004

JON W. DUDAS
*Director of the United States Patent and Trademark Office*